United States Patent [19]

Fujii et al.

[11] Patent Number: 4,982,096

[45] Date of Patent: Jan. 1, 1991

[54] MULTI-ELEMENT RADIATION DETECTOR

[75] Inventors: Hideji Fujii, Nishitama; Manabu Nakagawa, Tsukui; Minoru Yoshida; Fumio Kawaguchi, both of Nishitama; Tetsuhiko Takahashi, Suginami; Takayuki Hayakawa, Hachioji, all of Japan

[73] Assignee: Hitachi Medical Corporation, Tokyo, Japan

[21] Appl. No.: 293,764

[22] Filed: Jan. 5, 1989

Related U.S. Application Data

[63] Continuation-in-part of Ser. No. 239,387, Sep. 1, 1988, and a continuation-in-part of Ser. No. 261,420, Oct. 24, 1988.

[30] Foreign Application Priority Data

Jan. 6, 1988 [JP] Japan ............................... 63-1014
Jan. 27, 1988 [JP] Japan ............................... 63-14443

[51] Int. Cl.⁵ ............................................. G01T 1/20
[52] U.S. Cl. ................................. 250/367; 250/366; 250/370.11
[58] Field of Search ................. 250/370.11, 367, 366

[56] References Cited

U.S. PATENT DOCUMENTS

| | | | |
|---|---|---|---|
| 4,276,476 | 6/1981 | Cotic | 250/385.1 |
| 4,429,227 | 1/1984 | DiBianca et al. | 250/367 |
| 4,442,360 | 4/1984 | Suzuki et al. | 250/486.1 |
| 4,621,194 | 11/1986 | Yoshida et al. | 250/367 |
| 4,725,734 | 2/1988 | Nishiki | 250/366 |

FOREIGN PATENT DOCUMENTS

| | | | |
|---|---|---|---|
| 60-86480 | 5/1985 | Japan | 250/370.11 |
| 62-235588 | 10/1987 | Japan | 250/370.11 |
| 64-63886 | 3/1989 | Japan . | |
| 64-78185 | 3/1989 | Japan . | |
| 01-113690 | 5/1989 | Japan . | |
| 01-126583 | 5/1989 | Japan . | |
| 01-172791 | 7/1989 | Japan . | |
| 01-172792 | 7/1989 | Japan . | |

*Primary Examiner*—Constantine Hannaher
*Attorney, Agent, or Firm*—Antonelli, Terry, Stout & Kraus

[57] ABSTRACT

In a radiation detector, scintillation material flouoresces and the produced light is converted to electrical energy in an adjacent converter, separators are provided in spaces between the adjacent scintillators and converters. The separators may have a greater length than the adjacent scintillators, so that they will extend beyond to reduce cross-talk. The separators can extend toward the source of radiation for a height substantially greater than, and particularly five times, the height of the spaces between the adjacent scintillators to prevent X-ray scattering and function as a collimator. Optically opaque adhesive may be provided on the opposite ends of separators and pairs of scintillators and collimators, to prevent cross-talk.

28 Claims, 7 Drawing Sheets $t_3 = t_4 = \frac{1}{2} \cdot t_0$ $t_0 = t_1 + t_2$
$t_1 \neq t_2$

MULTI-ELEMENT RADIATION DETECTOR

The present application is a continuation in part of U.S. Patent Application Ser. No. 239,387, filed Sept. 1, 1988 (corresponding to Japanese Patent Application Nos. 62-234805 filed Sept. 21, 1987 and No. 62-220115 filed Sept. 4, 1987) and U.S. Patent Application Ser. No. 261,420 titled "RADIATION DETECTOR AND MANUFACTURING PROCESS THEREOF", filed Oct. 24, 1988 (corresponding to Japanese Patent Application Nos. 62-270200, 62-332334, 62-332333, 62-283075).

BACKGROUND OF THE INVENTION

The present invention relates to a radiation detector, and more particularly to an X-ray detector suitable for a full-length X-ray computed tomograph apparatus, hereinafter referred to as "X-ray CT".

The structure of a conventional X-ray solid detector is described in Japanese Patent Laid-Open No. 118977/1983.

An ionization chamber X-ray detector using ionization of a rare gas is disclosed in Japanese Patent Application Publication No. 58429/1985. A solid state detector using fluorescence is compact and provides reduced cost of production, with solid detectors being disclosed in Japanese Patent Laid-Open Nos. 263456/1985, 81575/1984, 141087/1984, and U. S. Pat. No. 4,429,227.

The Japanese Patent Laid-Open No. 263456/1985 shows a solid state detector that consists of a light emission portion using incident X-rays and a photo-electric conversion portion for receiving and detecting the light.

SUMMARY

It is an object of the present invention to provide an improved radiation detector of the solid state type.

In a radiation detector, wherein scintillation material fluoresces and the produced light is converted to electrical energy in an adjacent converter, separators are provided in spaces between the adjacent scintillators and converters. The separators may have a greater length than the adjacent scintillators and converters, so that they will extend therebeyond to reduce cross-talk and assembly misalignment problems. The separators can also extend toward the source of radiation for a height substantially greater than, particularly five times, the height of the grooves between the adjacent scintillators to prevent X-ray scattering and function as a collimator. Optically opaque adhesive may be provided on the opposite ends of separators and pairs of scintillators and collimators, to prevent cross-talk. The converters can be constructed as diodes, particularly on a substrate with spaces therebetween aligned with the separators. The diodes extend beyond the ends of the scintillators to provide reference locations for the cutting of the scintillators from a solid block of scintillation material. Vacuum deposition forming may be used for a light reflective layer on the separators to provide for very accurate matching of separator width with groove width, within the range of 10 to 20 microns. A group of scintillators with separators between scintillators and converters may be integrally and rigidly joined together as a unitary detector element, with a plurality of like elements being connected together. Side separators are provided therebetween, for forming larger units, and the side separators between the adjacent element are formed on at least one of the sides of each element, and preferably both opposite sides of each elements, with the total width of the side separator between adjacent detector elements being substantially equal to the width of each of the separators within each element.

BRIEF DESCRIPTION OF THE DRAWING

Further objects, features and advantages of the present invention will become clear from the following detailed description of a preferred embodiment shown in the drawing, wherein.

DETAILED DESCRIPTION OF PREFERRED EMBODIMENT

Figure 2:
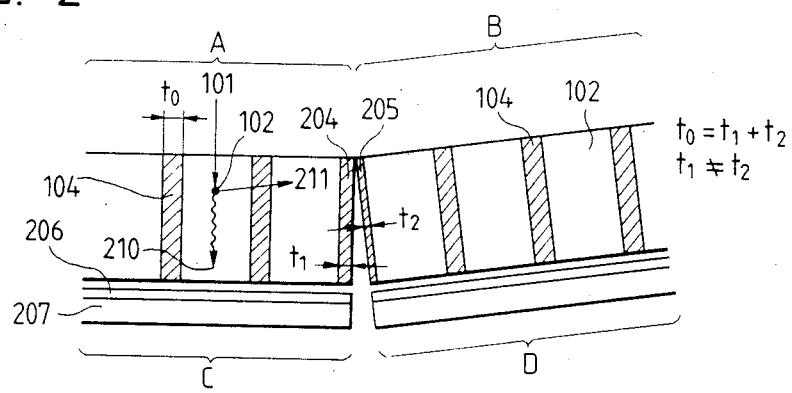
FIG. 2 is a end elevational view of a multi-element radiation detector useful in analyzing the conceptional portion of the embodiment of FIG. 1.

As one portion of the present invention, there is the following analysis of a problem that may be encountered in conventional structure, with reference to FIG. 2. An incident X-ray radiation 101 falls upon a scintillator 102, which generates light or fluorescence 210 and a scattering X-ray 211. The resulting fluorescence 210 is guided to a photo-electric converter 206 by a separator 104. The separator 104 is located on both sides of the scintillator 102 and is impervious to X-ray radiation while being reflective to light. At opposite sides of the photo-electric element there are outer side separators 204, 205, which are adjacent to each other for adjacent detector elements A and B, when a plurality of like elements are placed side by side to construct a larger detector.

The photo-electric converters 206 are supported by a casing or support 207 on one side, and secured on the other side to the scintillator blocks. That is, the scintillation devices A and B are mounted and fixed on the photo-electric converters 206, which are in corresponding groupings C and D. A plurality of the thus constructed elements A, C and B, D are connected together to form a larger detector.

In FIG. 2, the thickness to of the separator 104 inside the element block and the thickness t1, t2 of the outermost separators 204, 205 have conventionally held the relationship that thickness to equals t1 plus t2. However, in the conventional construction, there has been no particular analysis or consideration given to these relative thicknesses.

Figure 3:
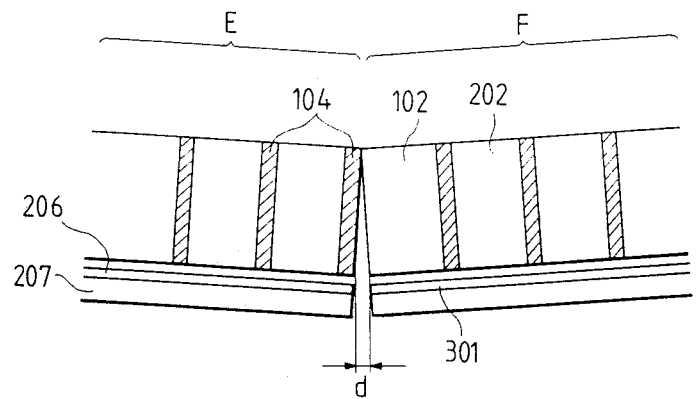
FIG. 3 is a end elevational view of a variation of the detector shown in FIG. 2, used in the analysis of the embodiment of FIG. 1.

Conventionally, either t1 or t2 has been set to zero, and the other of t2, t1 has been set equal to t0, as shown in FIG. 3. That is, one of the separators 204, 205 has been the same as one of the interior separators 104, with the other of the separators 205, 204 is effectively nonexistent.

As shown in FIG. 3, detector elements E and F are arranged on one side of a polygon to construct a larger element, and they are adjacent to each other with a small acute angle, so that all of the elements together may form an approximation of an arc having its center at the X-ray focus. Therefore, a gap d is defined at the lower portions of the blocks E and F. Since the outermost separator exists on only either the block E or the block F, converging efficiency of the resulting fluorescence will drop for the element 301, because the scattering X-rays and light will escape through the gap d; for this reason, sensitivity, energy characteristics and noise quantity of the scintillation 102 at the end portion, for one end, become different from that at the opposite end, and a ring-like artifact occurs as a false image. If a block E having a separator at its end portions exists, than a block F not having separators at its ends must also exist, requiring two different kinds of blocks to be manufactured, and complicating the assembly process of a larger device constructed of a number of elements. Accordingly, this imposes some limitations on the mounting and arrangement of the support, so that the production yield eventually drops.

Accordingly, it is seen from an analysis of the conventional style of structure that a ring-like artifact or false image occurs and production yield drops when one of the outermost separators is constructed to be of equal thickness to the internal separators.

Further, the conventional methods do not consider the variations in thickness of the separators and the resulting fluctuations in cross-talk quantity. Thus, the conventional techniques have employed variations for the thicknesses t0, t1 and t2, within a single detector element and with respect to a plurality of detector elements. The factors that determine the upper limit of the error are a geometric pitch error and a cross-talk quantity to adjacent channels due to scattering X-rays. In FIG. 2, cross-talk occurs if the scattering X-ray 211 is incident into adjacent elements through a separator 104, or separators 204 and 205. If the quantity of this cross-talk varies between elements, the ring-like artifact and a linear artifact occur on a CT reproduced image.

The quantity of the scattering X-ray incident into the adjacent elements through the separators 104, 204 and 205, that is, the cross-talk quantity is determined by the wave length of the scattering X-rays, self-absorption inside the scintillation element, and the material and thickness of the separator. In the CT X-ray detector, the variations of t0 and t1 plus t2 result in the variation in the cross-talk quantity due to the scattering X-rays. The allowable value of variation in the cross-talk quantity varies with the system or with an imaging portion. Therefore, the upper limit value of radiation and thickness of the separator generally cannot be be determined. When a 0.1 to 0.2 mm - thick material of tungsten, or molybdenum or tantalum is used, for example, it is on the order of several microns.

The required value for the variation in the thickness of the separators is more severe than the requirement for the geometric pitch deviation. Therefore, if the difference between t0 and t1 plus t2 is above a value that generates a significant difference of the cross-talk quantity due to the scattering X-rays, there is a possibility that the ring-like artifact and the linear artifact will form.

The various conventional techniques described above do not sufficiently take into consideration the share of the thickness of the separators inside the detector elements; the thickness of the separators at the outermost sides of the detector elements, and the error of the thickness of the separators. The problem occurs that the ring-like artifact or the linear artifact is present in the CT reproduced image. The present invention overcomes the problems described above and provides a multi-element radiation detector that can reduce the occurrence of the artifacts on the CT reproduced image by optimizing the thickness of the separators inside the element blocks and the thickness of the separators at the outermost side portions of the detector elements, and by taking the error of the separators into consideration.

In the multi-element radiation detector in accordance with the present invention, the errors of the thickness of the separators inside the detector elements and the thickness of the separators at the outermost side portions are reduced to such an extent that the difference in the cross-talk quantity due to the scattering X-rays can be neglected. Accordingly, the ring-like artifact and the linear artifact due to the cross-talk difference can be prevented. In the present invention, it is preferable that the thickness of the separator at the outermost side portions of the detector element is one half of the thickness of the separator inside of the detector element, with separators are disposed at both outermost side portions of each detector element, so that the gap between the scintillator element at the outermost side portions and the separator is eliminated and the ring-like artifact due to the occurrence of this gap can therefore be prevented.

Figure 1:
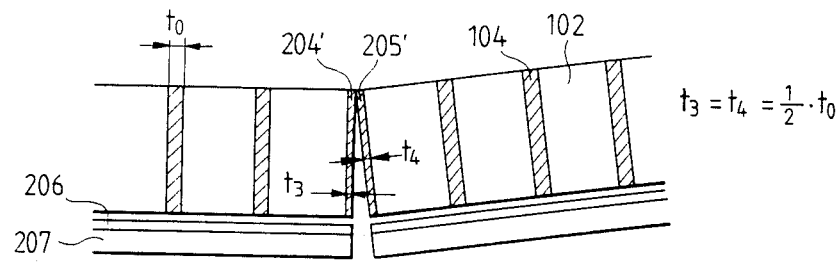
FIG. 1 is a schematic end elevational view of a multi-element radiation detector in accordance with the embodiment of the present invention.

FIG. 1 is an illustration, schematic, of the relationship of the separators to be employed throughout the embodiments of the present invention.

In the cross-sectional view of FIG. 1, two detector elements are placed side-by-side in the construction of a detector composed of many such detector elements that are identical to each other. The scintillation blocks 102 an the separators 104 are arranged alternately, and outermost side separators 204' and 205' of adjacent scintillation elements are arranged adjacent to each other. These outermost separators 204' and 205' each have a thickness equal to one-half of the thickness of the interior separators 104, and the outermost separators 204', 205' are bonded or otherwise connected by adhesive to the outermost sides of the scintillation elements, at the opposite outermost sides of each scintillation element. The scintillation blocks 102 and separators 104, 204', 205' are joined to the photo-electric converters 206, and in turn connected to the support 207.

The sum of the thicknesses of the outermost separators 204', 205' that, t3 plus t4, is made equal to the thickness t0 of the interior separators 104, within an accuracy of 5 micrometers, for example, so that no significant difference will occur in the cross-talk quantity due to the scattering of X-rays. Tungsten, tantalum or molybdenum is used as the material of the separators 104, 204' and 205'

Figure 5:
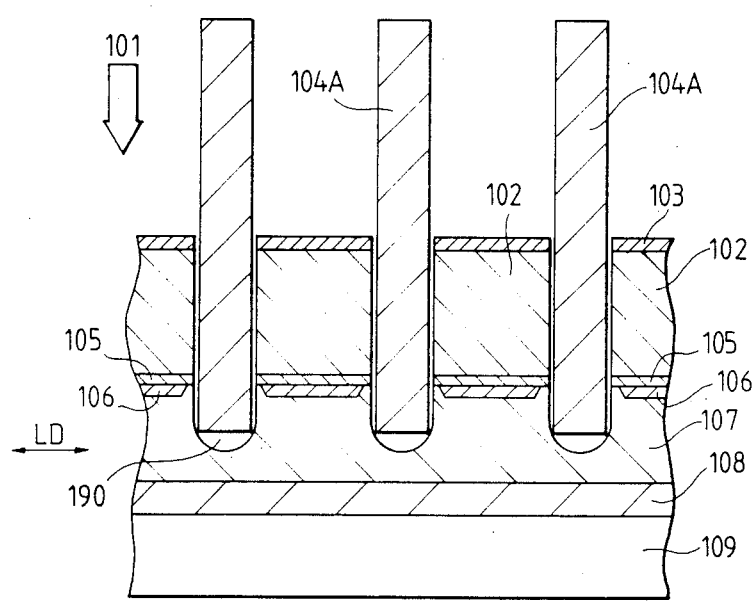
FIG. 5 is a view similar to FIG. 4, but of a variation of the separator.

Accordingly, separators 204' and 205' exist at both outermost side portions of the detector element and no gaps occur between the separators and the scintillation blocks 102 when the blocks and separators are mounted on to the support 207. Therefore, there is no difference in the characteristics between the scintillation blocks at the outermost side of a detector element and scintillation blocks interior of the detector element. The thickness t0 of the internal separators 104 and the thickness t3, t4 of the separators 204' and 205' at the outermost side portions are adjusted so that no significant difference exists that would incur cross-talk quantities due to scattering X-rays. The benefits of the above described structure are the reduction of the occurrence of the ring-like or linear artifact on the CT reproduced image. Since the thicknesses t3 and t4 of the outermost side separators 204' and 205' are made equal to each other, only one type of outermost separator need be employed and the detector elements are identical and symmetrical to make their assembly easier to produce a larger detector. Therefore, a mounting of the detector elements on the support can be made easier and smoothly without a limitation to the mounting direction or the sequence of arrangement so that production yield can be improved. In the preferred embodiment, it is preferable that the thickness of each of the outermost separators 204' and 205' be equal to each other and equal to one-half of the thickness t0 of the interior separators 104, but in any event the sum of the thicknesses 204' and 205' is made equal to that of the internal separators, because of significant errors that will produce the difference in cross-talk quantities due to scattering of X-rays. The present invention is also effective when it is supplied to the X-ray CT. While the section of the separators is kept triangular (with both surfaces being non-parallel) as shown in FIG. 5 of the aforementioned Japanese Patent Laid-Open No. 24174/1987.

The above-discussed thickness relationships of the separators is usable throughout the remainder of the described preferred embodiments, wherein the structure of the separators, scintillation blocks, photo-electric converters, and their method of construction will be set forth in more detail.

Figure 6:
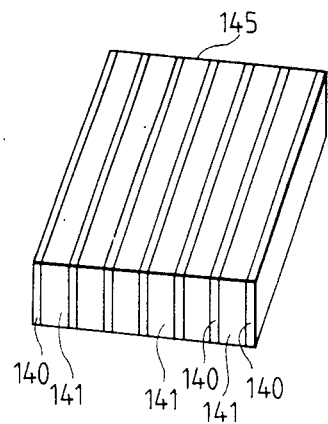
FIG. 6 is a perspective view of a multi-channel scintillator that may be used with the present invention.
Figure 7:
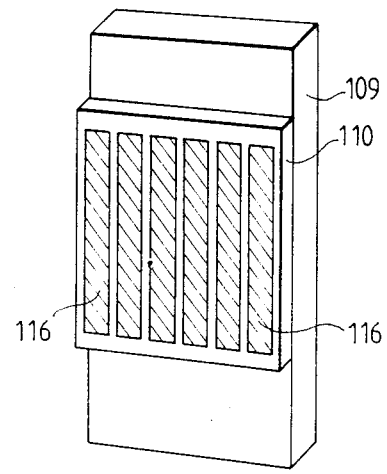
FIG. 7 is a perspective view of a multi-channel photo-electric conversion element, schematically showing the present invention.

An ionization chamber X-ray detector using ionization of a rare gas has been widely employed in the past as an X-ray detector for X-ray CT, as described, for example, in Japanese Patent Publication No. 58429/1985. However, the development of a solid-state detector using fluorescence has been made in order to obtain high resolution, to make the apparatus compact and to reduce the cost of production. Examples of such solid state detectors are disclosed in Japanese Patent Laid-Open Numbers 263456/1985, 81575/1984, 141087/1984 and U.S. Pat. No. 4,429,227. The typical construction of the solid state detector will be described with reference to the contents of Japanese Patent Laid-Open Number 263456/1985. This solid state detector has a light-emission portion using incident X-rays as the incident radiation to be detected and a photo-electric converter for receiving and detecting the emitted light. As shown in FIG. 6, a multi-channel scintillation element 145 is produced by sequentially bonding scintillation elements 141 through separators 140, which are coated with a light-reflecting agent and consist of a thin sheet of heavy metal having high X-ray absorbance. Various types of photo-electric converters are used for the light reception portion immediately below the scintillation blocks, but multi-channel photo-electric converters are used to implement the multi-channel scintillation device as shown in FIG. 6. PIN or PN type silicon photo diodes are mostly used as the photo-electric converters. FIG. 7 shows the structure of a multi-channel photo-electric converter element. A plurality of photo-electric converters 116, which detect the light, are formed on one semi-conductor substrate 110 and this semi-conductor substrate is integrated with an insulating substrate 109. The solid state detector is produced by bonding the multi-channel scintillation element 145 shown in FIG. 6 to the multi-channel photo-electric converter shown in FIG. 7 with an optically transparent adhesive in such a manner that each channel is in alignment with the other.

Figure 8:
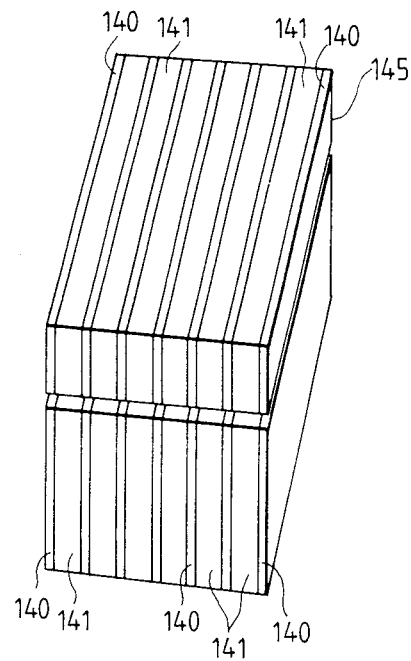
FIG. 8 is a perspective view of a multi-channel scintillator such as shown in FIG. 6 may be constructed from a larger block of material.
Figure 9:
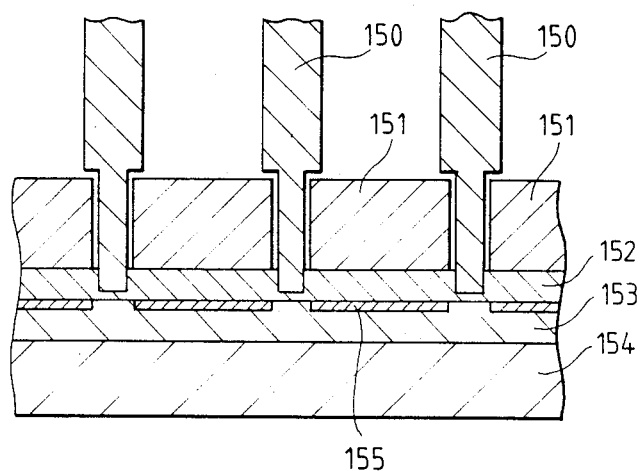
FIG. 9 is an end cross-sectional elevational view at the center of the longitudinal element showing a construction that is useful in explaining the present invention.

In order to bring each channel into alignment, dimensional accuracy of the multi-channel scintillation blocks in FIG. 3, particularly the pitch accuracy of the scintillator blocks and accuracy of width of the scintillator blocks are very important. Channel misalignment results in variations in detection sensitivity for each channel and produces the X-ray CT image with an artifact. The bond surface between the multi-channel scintillation blocks 145 and the multi-channel photo-electric converter elements must be flat. Any corrulation on the fluorescent output surface of the scintillation elements, any corrugation of the partitions in the direction of height of the scintillation blocks and any corrugation of the light receptive surface of the photo-electric converters will result in optical leakage between the channels and also provide the X-ray CT image with the artifact. The production of the multi-channel scintillation blocks 145 shown in FIG. 6 needs complicated production steps for which high accuracy is required. FIG. 8 shows the outline of an improved production method of the multi-channel scintillation blocks 145 disclosed in Japanese Patent Laid-Open No. 81575/1984. A predetermined number of scintillation thin sheets 141 and thin sheets of separators 140 of specific sizes are alternately bonded and integrated with an adhesive, and after the adhesive has solidified, the multi-channel scintillation element 145 is produced effectively by using a diamond cutter or a multi-wire saw to provide the cuts schematically shown in FIG. 8. Since a high level of accuracy is necessary for the scintillation element 145 as described already, bonding of the scintillation thin sheets 141 and separators 140 must be made uniform and accurate for each of the bonding surfaces, so that the thickness of the bonding layer becomes uniform, which is quite difficult. In such a construction as shown in FIGS. 6-8, both the scintillation sheets 141 and the separator sheets 140 have the same height so that the detector produced therefrom has low directivity to the incident X-rays and produces a large quantity of scattering beams of radiation. To solve this problem, it has been known to provide a detector wherein the quantity of scattering is reduced. FIG. 9, with reference to U.S. Pat. No. 4,429,227, discloses thin sheet separators 150, which function as a collimator for reducing the quantity of incident radiation scattering beams and also as separators for preventing optical linkage between the adjacent channels. These separators are made of tungsten or a high-density material and are mounted in such a manner as to keep a predetermined positional relationship with the scintillation blocks 151. The scintillation blocks 151 face the light receptive surface 155 of photo diodes 153 that are on a substrate 154 through the employment of optical grease 152. In this conventional example, the thin sheet 150 must have a complicated shape and optical leakage exists between the adjacent channels through the gaps between the thin sheets 150 and the light reception surfaces 155.

Figure 10:
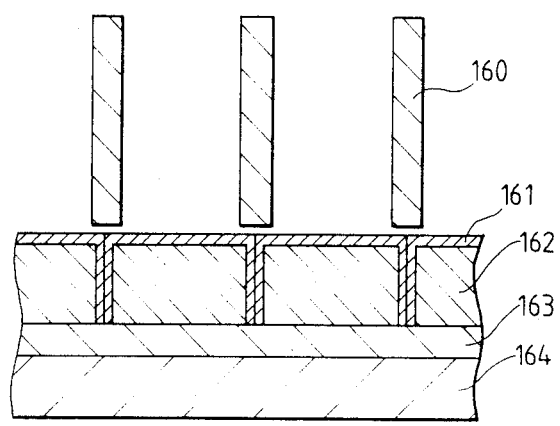
FIG. 10 is an end cross-sectional view in the center of a detector element, which is useful in explaining the present invention.

FIG. 10 relates to an analysis of the structure shown in Japanese Patent Laid-Open No. 141087/1984, which uses a cadmium tung-state crystal 162 as the scintillation block material. This example utilizes high X-ray absorbance and eliminates the separators between the scintillation elements. A light reflection layer 161 is formed on the surface of the scintillation blocks 162 to prevent optical leakage to the adjacent channels. The collimators 160 are positioned by the use of a jig to be located correctly with respect to a bonding portion of the scintillation blocks. The scintillation blocks face the light reception devices or photo-electric converters 163 that are on a substrate 164 through an optical coupler. This example provides the advantage that the collimator portion can be produced independently of the X-ray detection element portion. However, the scintillation blocks must be produced accurately one by one in the same way as in the example shown in FIG. 9, and optical treatment must be made to the scintillation surface, whenever necessary. Thus, a large number of production steps are necessary.

The conventional techniques as analyzed above, did not take into consideration the production requirement for the X-ray detector in regard to the corrugation of the fluorescence output surface of the multi-channel scintillation blocks and the corrugation of the light reflection surface of the multi-channel photo-electric converters that cause optical leakage between adjacent channels. Therefore, the conventional techniques involve the limit in reducing optical leakage. Further, since complicated production steps are needed, the production is not free from the problems of production cost and yield of the multi-channel scintillation blocks.

According to preferred structure and manufacturing techniques in the present invention, detectors may be economically made with high performance for the X-ray CT through simple production steps while minimize leakage between adjacent channels. The above described problems can be solved by bonding and fixing scintillation block thin sheets, each having a fixed thickness, to the light reception surface of a multi-channel photo-electric element with an optically transparent adhesive; thereafter forming grooves for inserting separators at the center of the dead zone between adjacent photo-electric converters in such a manner as to reach the inside of the semi-conductor substrate, preferably. The grooves start at the scintillation block incident radiation surface. The electrically insulating substrate can support, or carry, thin film-type photo-electric converters, manufactured according to thin film technology. Thereafter the separators are inserted and fixed within the grooves.

Each separator is inserted to the bottom of its groove, preferably down to the inside of the semi-conductor substrate that forms the photo-electric converter elements or the inside of an electrically insulating substrate that forms the support or carrier of the semi-conductor substrate or the thin film technology-type photo-electric converters. Accordingly, optical leakage between the adjacent channels can be minimized without being affected by the corrugation on the fluorescence output surface of multi-channel scintillation blocks or the corrugation of the light reception surface of multi-channel photo-electric converter elements as in conventional technology.

Figure 4:
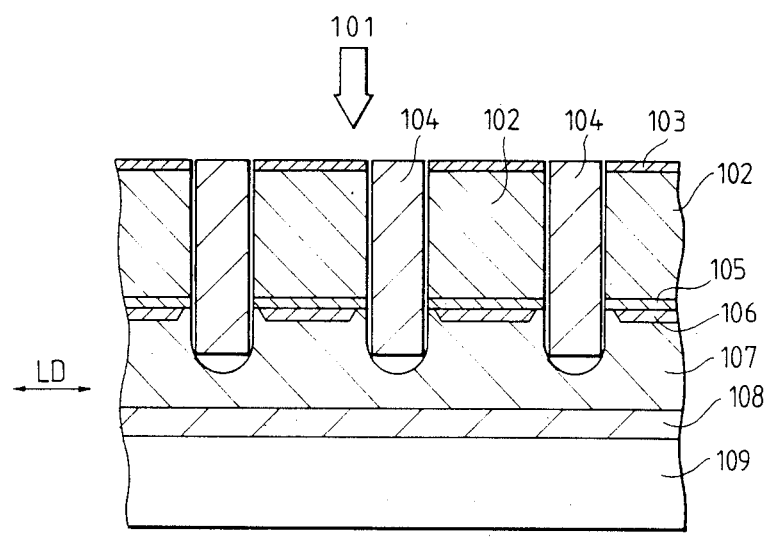
FIG. 4 is an end cross-sectional elevational view of a portion of one of the detector elements shown in FIG. 1, in greater detail, as taken along I—I of FIG. 17.

With reference to FIG. 4, each scintillation block 102 faces the light reception surface at the top of layer 106 of a multi-channel photo-electric converter grouping, through an optically transparent adhesive layer 105. The photo-electric converters shown in FIG. 4 are of the PIN type silicon photo diodes. These diodes consist of a P plus layer 106 and I layer 107 and N plus layer 108, all on an electrically insulating substrate 109, according to known technology. The light reception surface of the layer 106 corresponds to the portion Where the P plus layer 106 is formed in the shape of a thinly elongated island. Light reflection layers 103 are formed on the surfaces of the scintillation blocks 102 on the X-ray incident side 101 and on the two side surfaces (not shown in FIG. 4) of the detector element in the longitudinal direction LD, that is both side surfaces having smaller surface areas among the surfaces crossing at right angles the X-ray incident surface 103. Each separator 104 has surfaces of, for example aluminum, to help with reflectivity, and on top of this, to prevent conduction, is an optically transparent and electrically insulating layer made of molybdenum, tantalum, tungsten, lead or an alloy consisting principally of these elements, and such layer is 0.1 to 0.2 mm thick in order to prevent optical leakage between the adjacent channels and to improve converging efficiency of the fluorescence generated inside the scintillation blocks to the photo-electric converters. Each groove into which each separator 104 described above is to be inserted is positioned at the center of the dead zone existing between adjacent light receptive surfaces 106, that is between adjacent P plus layers of the diode. These grooves are preferably formed by means of a diamond cutter with extreme accuracy, and the grooves, in FIG. 4, extend inwardly to the intermediate portion of the 1 layer 107 through the scintillation blocks 102 and the adhesive layer 105. That is, the scintillation material may be a thin sheet having a very flat lower surface bonded by adhesive 105 to the very flat upper surface of the optical-electrical conversion construction, to effectively form a solid integrated block, which is thereafter grooved With the diamond saw as mentioned.

Such a structure can be produced by the following method.

Figure 11:
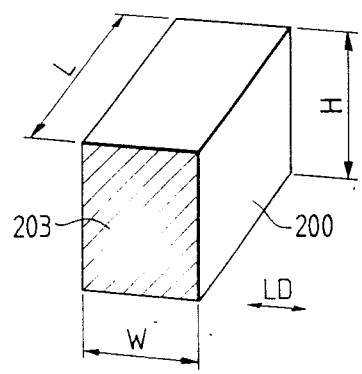
FIG. 11 is a perspective view of a block of material usable according to the present invention to obtain scintillation elements.

As shown in FIG. 11, a solid block of scintillation material 200 having the dimensions L, W and H is cut from a scintillation mass formed by a hot isostatic press of powdery fluorescent material such as ZnS:Ag, $Ba_2GdSbO_4$, $Ba_2BiInO_6$, $Ba_2BiYO_6$, $GdPb_2WO_6$, $La_2O_2SiTb$, ZnCdSiAg, LaOBr:DyCdS, etc., or a single crystal such as $Zn_2SiO_4$, $CaWO_4$, $CdWO_4$, $ZnWO_4$ CsI:Na, CsIiTl, NaI:Tl, $Gd_2SiO_4$:Ce, $Bi_4Ge_3O_{12}$, $CaF_2$:Eu, etc. The two surfaces 203 defined by the dimensions W and H become the surfaces that eventually correspond to the longitudinal direction LD of the scintillation blocks. A light reflecting layer or coating containing barium sulfate or titanium dioxide is applied to the two surfaces 203 or an aluminum vacuum deposition layer is used to form a light reflecting layer on the two surfaces 203. The dimension L is equal to the length of the scintillation element, while the dimension W should be a little greater than the width of the multi-channel photo-electric conversion element in the channel direction. This dimension H may be such that a suitable number of scintillation thin sheets 102 having a fixed thickness t, as shown in FIG. 12, can be cut therefrom.

Figure 12:
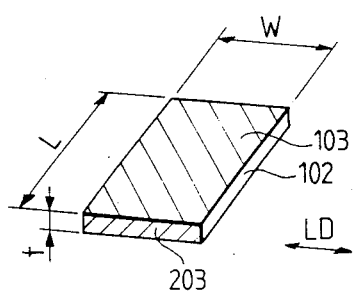
FIG. 12 is a perspective view of a scintillation material in sheet form cut from the block of FIG. 11.

As shown in FIG. 12, the scintillation thin sheet 102 has an accurate thickness t, having been accurately cut from the scintillation block 200 shown in FIG. 11. The light reflection layer 103 is formed on one of the surfaces having the maximum area in the same way as the surfaces 203. The surface of the scintillation thin sheet 102 having the maximum length, but not having the light reflection layer, is bonded and fixed to the surface of the multi-channel photo-electric conversion sheet 110, with a light transmissive adhesive. Since the multi-channel photo-electric converters are in sheet form and the scintillation material is in sheet form, surfaces to be bonded can be made very flat and accurate, to prevent light leakage or cross-talk.

Figure 13:
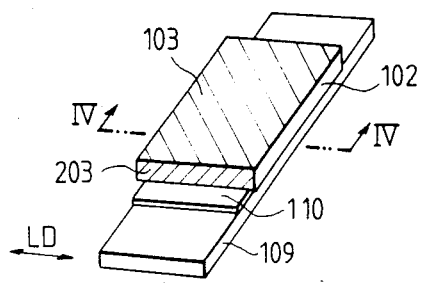
FIG. 13 is a perspective view showing the assembly of the element, at an intermediate stage.
Figure 14:
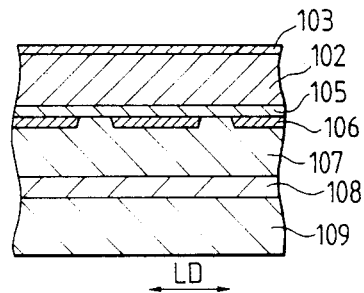
FIG. 14 is a cross-sectional elevational end view of the intermediate stage element taking along line XIV—XIV of FIG. 13.

FIG. 13 shows the state when the bonding, described above, is completed, and FIG. 14 shows a cross-sectional section of the lamination, as taken along line IV—IV. The existence of the adhesive layer 105 provides the advantage that the output can be improved by 30 to 40% in comparison with the case where the light detection portion and the light emission portion are such as those described above with respect to the conventional structure. This highly advantageous result is obtained by the above method, for the above reasons, particularly involving the handling of sheets that may be provided with very flat mating surfaces, to thereafter reduce cross-talk when they are assembled, all prior to forming any grooves. The 30 to 40% output advantage with the present structure is compared with a structure such as that produced by Japanese Utility Model patent Laid-Open No. 154880/1985, which is otherwise identical in structure to a detector constructed according to the present teachings.

As shown in FIG. 13, the length of the multi-channel photo-electric detector 110 is greater than the length of the scintillation element 102 and the positions of the dead zones (not seen in FIG. 10) that exists between the adjacent light reception surfaces of P plus layer 106 of the photo-electric converter 110 can be visually observed, because they are visually exposed on the top surface of the sheet 110, without being covered by the scintillation thin sheet 102. This exposure is at both ends of the detector element, in the direction of the grooves (not yet made).

Figure 15:
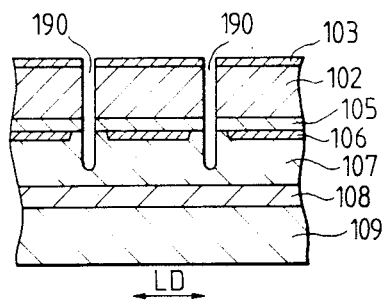
FIG. 15 shows one form of the scintillation element cut from the intermediate stag of FIG. 14.
Figure 17:
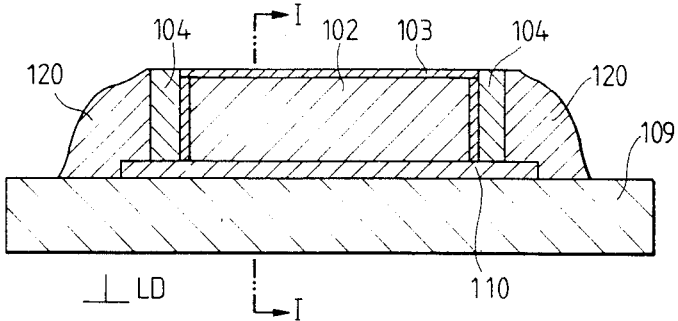
FIG. 17 is a side elevational cross-sectional view according to the present invention.

As shown in FIG. 15, grooves 190 are each formed at the center of the dead zones, as previously described. To prevent entering of electrical noise and to keep the mechanical strength of the semi-conductor substrate forming the photo-electric converters, the depth of each groove is such that the groove reaches into the intermediate portion of the I layer 107, but does not reach the N plus layer 108. The width of the groove 190 is smaller than that of the dead zone, but is a little bit greater, for example by 10 to 20 microns, than the thickness of the separator 104 (not seen in FIG. 15). In order to increase the effective area of the scintillation blocks 102, the light reflective property is given to the surface of each of the separators, preferably by a thin aluminum layer vacuum deposited or the like on to the accurately formed separator 104, rather than applying a inaccurate coating. Such a separator 104 is thus accurately formed in width and inserted down to the bottom of the groove 190. The height of the separator 104 is such that it is at the same level as the light reflection layer 103, or projects slightly from the latter. The separator 104 is longer than the scintillation block 102 as shown in FIG. 17 in order to prevent optical leakage between the adjacent channels at both ends of the element in the longitudinal direction. The separator 104 is thus inserted and stiffly bonded and fixed to the surface of the substrate 109 for mounting the multi-channel photo-electric converters 110 at both ends of the scintillation blocks in the longitudinal direction with an adhesive 120.

Figure 19:
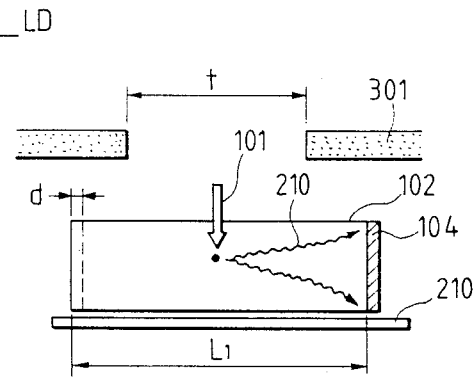
FIG. 19 is a portion of a detector element analyzing a portion of the present invention.

The advantage of having the separator longer than the scintillation blocks will now be described in detail. If a separator having the same length as that of the scintillation block is used, the separator 104 will be pulled between the scintillator elements 102 due to a very small manufacturing error in the arrangement shown in FIG. 19. In other words, there develops the gap portion having a width d near one end portion where the separator 104 does not exist and therefore the light 302 leaks through this gap d between the adjacent scintillation blocks 102, resulting in cross-talk. In FIG. 19, incident X-rays 101 are guided by the collimator 301. The quantity of cross-talk is determined by the gap width d, the X-ray absorption coefficient and light absorption coefficient of the scintillation blocks 102, the X-ray energy spectrum, the collimator opening t and the shape and size of the scintillation element 102.

Figure 20:
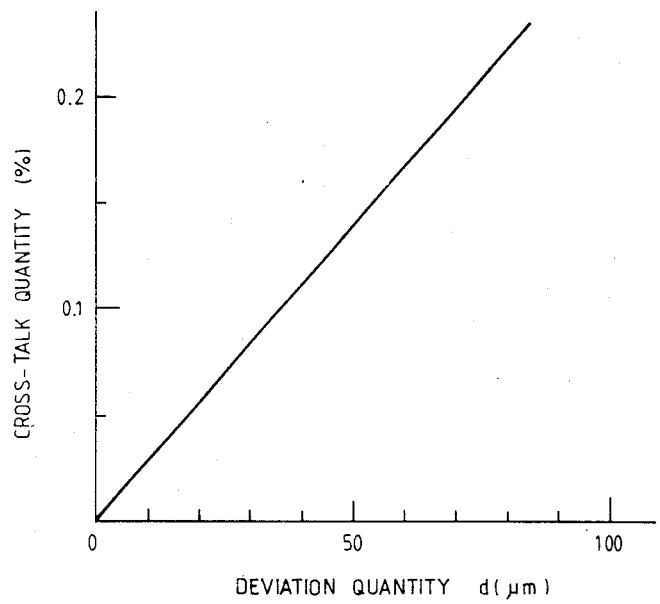
FIG. 20 is a graph showing the relationship between cross-talk quantity and deviation quantity.

FIG. 20 shows an example of a relationship between the distance d of the gap mentioned above and the quantity of the cross-talk produced by the gap.

If optical cross-talk occurs between the scintillation blocks and the quantity of cross-talk differs from the scintillation block to scintillation block, there is produced a ring-like artifact and the radial artifact. The threshold cross-talk quantity at which these artifacts do not occur is therefore different depending on the imaging conditions, but must be limited to below 0.05% in the case of a severe condition. In the case of the example shown in FIG. 20, the deviation quantity of the gap d must be below 20 micrometers in order to keep the quantity of cross-talk below 0.05%. The limit on the deviation quantity d becomes severe depending on the characteristics and shape of the scintillation blocks. In accordance with the conventional system shown in FIG. 2, it is not easy to secure such accuracy with a high yield.

Therefore, as in the embodiment shown in FIG. 17, the length of the separator, that is the length in the direction of the slice thickness of the tomogram, is made greater than the length of the scintillation block so as to absorb any dimension error during production and any assembly error in placing the separators. In this manner, it is possible to prevent the end of the separator from being placed inside of the scintillation block end. This will prevent the occurrence of any gap d and therefore prevent the occurrence of the cross-talk that results in the artifact. According to FIG. 17, the accuracy of the corresponding positioning between the scintillation blocks 102 and the light reflective surface is determined solely by the mechanical accuracy of a machine tool forming the groove 190. Therefore, the multiple channel detection element having high performance can be produced without producing independently the multichannel scintillation blocks as shown in FIG. 6.

Figure 21:
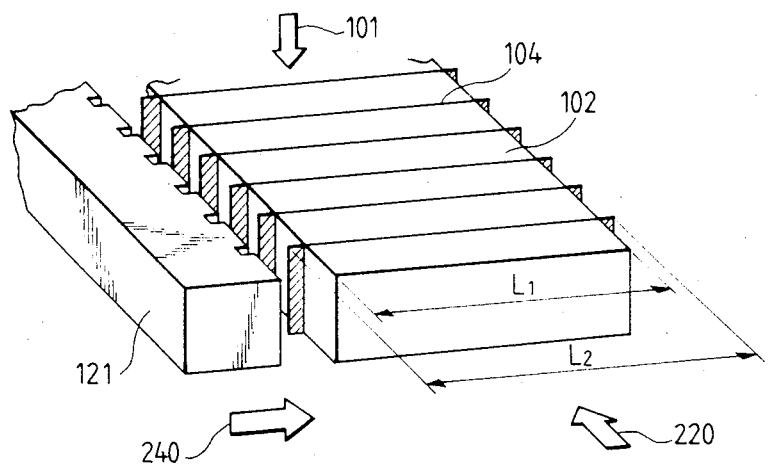
FIG. 21 is a perspective view, in schematic form, showing assembly of an element according to the present invention.

If an arrangement jig 121 for the scintillation blocks and the separators is used as shown in FIG. 21, it then becomes possible to limit the accurate positioning of the separators in the direction of slice thickness.

Figure 18:
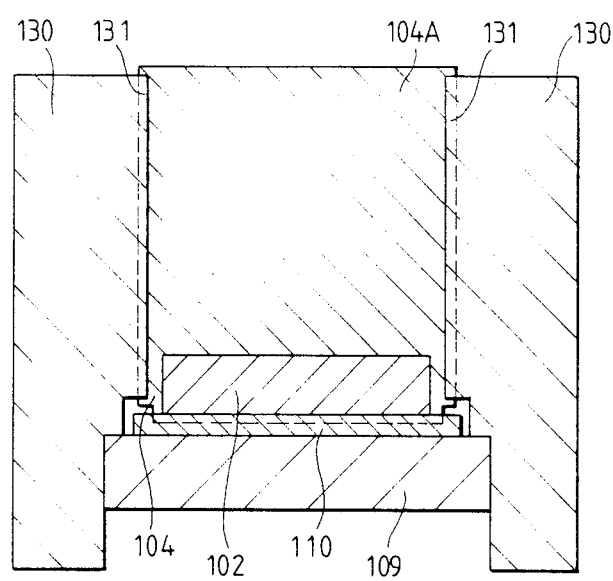
FIG. 18 is a side elevational view, cross section, showing assembly apparatus for assembling the element of the present invention.

As a further portion of the present invention, reference is made to FIG. 5. The separator is made of molybdenum, Tantalum, Tungsten, lead or the alloy consisting of these elements as its principal component. The separator is preferably 0.1 to 0.2 mm thick, as measured between adjacent scintillation blocks, and has the light reflecting property in the same manner as described above. The separators are inserted down to the bottom of the groove 190. Each separator 104A projects in the direction of the X-ray incident radiation 101 by at least five times the height of the scintillation element 102 from its surface as measured in the same direction. The difference between this construction and that previously described with respect to FIG. 4 resides in that the separator 104A is provided with the function of the collimator and reduces the quantity of scattering X-rays. It is thus possible to reduce the quantity of the occurrence of scattering X-rays and at the same time minimize optical leakage between the adjacent channels. In this case, since the height of the separator in the direction of incidents of X-rays becomes great, the separator 104A must be held sufficiently stiffly. An example of the support method is shown in FIG. 18. Supports 130, each having grooves 131, are located so that the pitch between the grooves 190 of the substrate 109 and the grooves 131 is set accurately by the jig, and members 102 and 109 are then fixed integrally. Each separator is inserted into the bottom of the groove 190 formed to the interior of the photo-electric converters 110 through the groove 131 and stiffly bonded and fixed into the grooves 131. Each group 131 is formed precisely by the same machine means as the means for performing the grooves 190 shown in FIG. 15 or FIG. 16.

A suitable example of the scintillation material for the scintillation blocks in the constructions of FIGS. 1 and 4, is $(Gd_{1-x-y}Pr_xCe_y)_2O_2S:F$, which is described in Japanese Patent Publication No. 4856/1985 and has a high conversion deficiency and a short persistence time. The fluorescence material is powdery and can be synthesized easily by hot isostatic pressing as described in Japanese Patent Laid-Open No. 52481/1987, and is from 1 to 1.5 mm thick, for example, with sufficient X-ray absorbance and light transmissivity. Therefore, X-ray detectors have been produced with high sensitivity and high performance by the structures according to FIGS. 1 and 4 described above.

If the X-ray absorbency of the scintillation material is not sufficiently great, the structures according to FIGS. 1 and 5 can be modified by bonding the material having a high light transmissivity and X-ray absorbance to the surface of the scintillation thin sheet that has the largest area but does not have the light reflecting property. An example of this modification is shown in FIG. 12, wherein the object of the present invention can be accomplished without forming the light reflection layer on the surfaces 203, 103. This is because, in FIG. 17, the black light intercepting adhesive or an optically opaque adhesive is used as the adhesive 120 and the optical leakage at both end portions of the scintillation blocks in the longitudinal direction can be minimized. Furthermore, if the structure shown in Japanese Patent Laid-open No. 59(1984)-46877 is employed for the X-ray incidence surface, optical leakage on the the X-ray incidence surface can be minimized.

Figure 16:
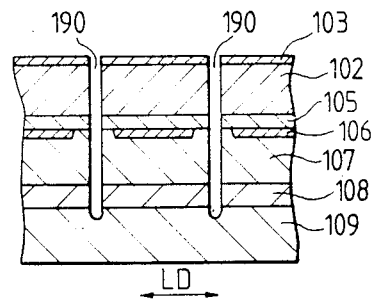
FIG. 16 shows another form of scintillation element cut from the intermediate stag of FIG. 14.

Although the above description is given with respect to a case where the depth of the groove for the insertion of the separator 104 is greater than that of the P plus layer of the photo-electric conversion element but is not below one-half of the thickness of the semiconductor substrate forming the photo-electric converters, FIG. 16 shows a further structure of the present invention where the groove reaches the inside of the substrate 109. In this case, each multi-channel photo-electric converter is separated by the grooves in the position of the dead zone so that the semiconductor material 106, 107, 108 forming the photo-electric converters and the substrate 109 must be bonded and connected stiffly to each other. In contrast, if the multi-channel photo-electric converters are formed directly on the electrically insulating substrate 109 using thin film technology, the above requirement with respect to stiff bonding becomes almost unnecessary. The method of forming the photo-electric converters by the thin film technology with amorphous silicon is well known in the art and is intended to be a part of the present invention. The structure shown in the various figures described above, can be used in combination with each other. Accordingly, optical leakage between adjacent channels can be minimized with the various described techniques and production is simplified. In the description of these embodiments, the explanation of the signal pickup route has been omitted because a large number of conventional techniques are well known, and such does not really form a part of the present invention. Although, PIN type silicon photo-diodes have been described in detail, various types of photo-electric converters may be used with the present invention.

While preferred embodiments along with variations and modifications have been set forth for disclosing the best mode and important details, further embodiments, variations and modifications are contemplated according to the broader aspects of the present invention, all as set forth in the spirit and scope of the following claims

We claim:

1. A radiation detector, comprising:
   a plurality of solid state scintillation block means for converting incident radiation to be detected into light;
   a semiconductor substrate having a surface separated into a plurality of regions by parallel spaced grooves of a predetermined depth, a plurality of optical-to-electrical converter diodes, each of said plurality of regions having a respective one of said optical-to-electrical converter diodes formed therein, said optical-to-electrical converter diodes being arranged adjacent to each of said scintillation block means on a side of said scintillation block means opposite to the incident radiation, said optical-to-electrical converter diodes being operative for receiving the light from the scintillation block means and for converting the received light into electrical energy;

means for integrally connecting each of said scintillation block means to a respective one of said plurality of regions having an optical-to-electrical converter diode formed therein so as to form operative pairs arranged in a generally planar serial array of operative pairs with uniform spaces between adjacent operative pairs, thereby forming a unitary rigid solid of alternately arranged operative pairs and spaces between adjacent operative pairs, said spaces extending to a bottom surface of each of said grooves; and a separator impervious to said incident radiation and said light, respectively disposed in each of said spaces and substantially completely filling the space between adjacent operative pairs.

2. The detector according to claim 1, wherein said means for integrally connecting comprises light transmissive adhesive.

3. The detector according to claim 1, wherein each of said optical-to-electrical converter diodes is a PIN-decoder, wherein
said grooves extend completely past the P layer of said diode and into the I layer of said diode, and
the depth of said grooves is not greater than one-half of the total thickness of said diode. means for integrally connecting comprises light transmissive adhesive.

4. The detector according to claim 3, wherein said grooves extend completely through each of the P, I and N layers of said PIN diodes, and wherein said means for integrally connecting includes a substrate integral to each of said N layers.

5. The device of claim 1, wherein each of said separators has a length, measured parallel to said grooves, substantially longer than the adjacent scintillation block means, to extend outwardly beyond the adjacent operative pairs at each end of said separators, for enabling a reduction in cross-talk between adjacent pairs.

6. The device of claim 5, further including an optically opaque adhesive material covering the ends of said separators and the ends of said pairs and bonding said separators to said adjacent pairs as an integral unit.

7. The detector according to claim 5, wherein said separators extend outwardly from said scintillation block means in the direction opposite from said optical-to-electrical converter diodes for a distance at least twice the height of said spaces for preventing incident radiation scattering and forming collimator means for collimating the incident radiation.

8. The detector according to claim 1, wherein said separators extend outwardly from said scintillation block means in the direction opposite from said optical-to-electrical converter diodes for a distance at least twice the height of said spaces for preventing incident radiation scattering and forming collimator means for collimating the incident radiation.

9. The detector according to claim 1, further including optically opaque adhesive means substantially covering the end surfaces of said separators and the adjacent operative pairs, at each end of said separators, said adhesive means bonding said separators to said pairs for reducing cross-talk between adjacent pairs.

10. A radiation detector according to claim 1, wherein each of said optical-to-electrical converter diodes includes a doped well having a width narrower than a width of each of said plurality of regions so that said grooves are spaced apart from said well.

11. A radiation detector, comprising:
a plurality of solid state scintillation block means for converting incident radiation to be measured into light;
a semiconductor substrate having a surface separated into a plurality of regions by parallel spaced grooves of a predetermined depth, a plurality of optical-to-electrical converter diodes, each of said plurality of regions having a respective one of said optical-to-electrical converter diodes formed therein, said optical-to-electrical converter diodes being arranged adjacent to each of said scintillation block means on a side of said scintillation block means opposite to the incident radiation, said optical-to-electrical converter diodes being operative for converting the light from the scintillation block means into electrical energy;
means for integrally connecting each of said scintillation block means to a respective one of said plurality of regions having an optical-to-electrical converter diode formed therein so as to form operative pairs arranged in a generally planar serial array with uniform spaces between adjacent operative pairs, thereby forming a unitary rigid solid of alternately arranged operative pairs and spaces between adjacent operative pairs, said spaces extending to a bottom surface of each of said grooves;
a separator, impervious to at least one of said incident radiation and said light, disposed in each of said spaces, each of said separators having a length, measured parallel to said grooves, substantially longer than the adjacent scintillation block means, to extend outwardly beyond the adjacent operative pairs at each end of said separators, for enabling a reduction in cross-talk between adjacent pairs; and
wherein said detector further includes an optically opaque adhesive material covering the ends of said separators and the ends of said operative pairs, said adhesive material bonding said separators to said adjacent pairs as an integral unit.

12. The detector of claim 11, wherein said separators extend outwardly from said scintillation block means in the direction opposite from said optical-to-electrical converter diodes for a distance at least twice the height of said spaces for preventing incident radiation scattering and forming collimator means for collimating the incident radiation.

13. A radiation detector, comprising:
a plurality of solid state scintillation block means for converting incident radiation to be measured into light;
a semiconductor substrate having a surface separated into a plurality of regions by parallel spaced grooves of a predetermined depth, a plurality of optical-to-electrical converter diodes, each of said plurality of regions having a respective one of said optical-to-electrical converter diodes formed therein, said optical-to-electrical converter diodes being arranged adjacent to each of said scintillation block means on a side of said scintillation block means opposite the incident radiation, said optical-to-electrical converter diodes being operative for converting the light from the scintillation block means into electrical energy;

means for integrally connecting each of said scintillation block means to a respective one of said plurality of regions having an optical-to-electrical converter diode formed therein so as to form operative pairs arranged in a generally planar serial array with uniform spaces between adjacent operative pairs, thereby forming a unitary rigid solid of alternately arranged operative pairs and spaces between adjacent operative pairs, said spaces extending to a bottom surface of each of said grooves; and a separator impervious to at least said incident radiation disposed in each of said spaces, wherein said separators extend outwardly from said optical-to-electrical converter diodes for a distance at least twice the height of said spaces for preventing incident radiation scattering and forming collimator means for collimating the incident radiation.

14. The detector of claim 13, wherein said separators extend for a distance substantially equal to five times the height of said spaces.

15. A radiation detector comprising:
a plurality of solid state scintillation blocks for converting incident radiation to be measured into light;
a semiconductor substrate having a surface separated into a plurality of regions by parallel spaced grooves of a predetermined depth, a plurality of optical-to-electrical converter diodes, each of said plurality of regions having a respective one of said optical-to-electrical converter diodes formed therein, said optical-to-electrical converter diodes being arranged adjacent to each of said scintillation blocks on a side of said scintillation blocks opposite to the incident radiation, said optical-to-electrical converter diodes being operative for converting the light from the scintillation blocks into electrical energy;
means for integrally connecting each of said scintillation blocks to a respective one of said plurality of regions having an optical-to-electrical converter diode formed therein so as to form operative pairs arranged in a generally planar serial array with uniform spaces between adjacent operative pairs, thereby forming a unitary rigid solid of alternately arranged operative pairs and spaces between adjacent operative pairs, said spaces extending to a bottom surface of each of said grooves;
a separator, impervious to at least one of said incident radiation and said light, disposed in each of said spaces; and
optically opaque adhesive means substantially covering the end surfaces of each of said separators and the adjacent operative pairs, at each end of said separators, said adhesive means bonding said separators to said pairs for reducing cross-talk between adjacent pairs.

16. The detector according to claim 15, wherein said optical-to-electrical converter diodes are solid state diodes formed on a single substrate bonded on said scintillation blocks.

17. The detector according to claim 16, wherein said diodes include spaced-apart doped wells having a spacing between them substantially greater than the thickness of said separators, said separators being disposed within said spacing and opposite sides of said separators are respectively spaced from said wells.

18. A method of manufacturing a radiation detector, comprising steps of:
forming an integral lamination of a scintillation sheet material laminate, a laminate having a plurality of optical-to-electrical diodes in spaced apart adjacent relationship, with uniform spaces therebetween of a fixed width, and a substrate laminate, in the recited order;
cutting equally spaced parallel grooves into said lamination at least into said scintillation sheet material, in alignment with said spaces, with said grooves being accurately cut of substantially the same width;
providing a plurality of radiation impermeable separators of a side to side width smaller than the width of said grooves, of a length at least equal to the length of said grooves and of a height at least equal to the height of said grooves;
vacuum deposition forming a light reflective layer on said separators to form the side surfaces of said separators and thereby accurately determining the width of said separators to slightly less than the width of said grooves; and thereafter assembling and securing said separators into said grooves.

19. The method according to claim 18, wherein said vacuum deposition forming provides the width of said separators within the range of 10 to 20 microns less than the width of said grooves.

20. A method for manufacturing a radiation detector, comprising the steps of:
providing a single monolithic sheet of scintillation material; providing a plurality of elongated optical-to-electrical converter diodes in spaced parallel relationship to each other on a monolithic sheet of substrate having a length, as measured in the direction of the diode elongation, substantially greater than the corresponding length of said scintillation material and the length of said diodes being substantially longer than the corresponding length of said scintillation material;
bonding said scintillation material onto said diodes and substrate so that said diodes extend beyond said scintillation sheet to be visually exposed at one end; and
detecting the dead space between adjacent exposed diodes and cutting elongated grooves at least completely through said scintillation material accurately in alignment with said dead spaces in accordance with said detecting.

21. The method according to claim 20, wherein said scintillation sheet and said diode substrate are bonded together so that said diodes and the dead space between them are exposed beyond the scintillation sheet at both ends; and said step of detecting detects the dead spaces at both ends and said step of cutting is responsive to said detecting at both ends to control said grooves to be parallel with the dead spaces between adjacent diodes.

22. A multi-element radiation detector, comprising;
a plurality of scintillation blocks elongated in one direction, parallel to each other and uniformly spaced to provide therebetween grooves, each of said scintillation blocks constituting transducer means for converting incident radiation to be detected into light;
a corresponding plurality of optical-to-electrical converters respectively connected to said scintillation blocks opposite from the incident radiation to form operative pairs;

a plurality of radiation impermeable separators filling said grooves for at least the length and height of said scintillation blocks for reducing cross-talk, each of said separators being substantially the same width, as measured between adjacent scintillation blocks;

support means securing all of said scintillation blocks and optical-to-electrical converters into a unitary detector element;

separator means, parallel to said separators, covering the complete side of at least one of the outermost ones of said scintillation blocks so that like detector elements may be placed in a side-by-side relationship with their separators parallel to each other and said separator means preventing cross-talk between adjacent detector elements, said separator means being formed on each of the opposite sides of said detector elements; and the width of said separator means between like detector elements being substantially equal to the width of each of said separators, wherein each of said separator means is one-half the thickness of said separators.

23. The detector according to claim 22, wherein the sum of the thicknesses of said separator means, for each detector element, is equal to the thickness of each of said separators of the same detector element within an accuracy of 5 microns.

24. The detector according to claim 22, wherein each of said separators is a separator impervious to said incident radiation and said light in each of said grooves substantially completely filling the grooves between adjacent scintillation block means and the space between adjacent optical-to-electrical converter means.

25. The detector according to claim 22, wherein each of said separators has a length, measured parallel to said grooves, substantially longer than the adjacent scintillation block, to extend outwardly beyond the adjacent pairs at each end of said separators, for reducing cross-talk between adjacent pairs.

26. The detector according to claim 22, wherein said separators extending outwardly from said scintillation block in the direction opposite from said optical-to-electrical converters for a distance at least twice the height of said grooves as measured in the same direction for preventing incident radiation scattering and constituting collimator means for the incident radiation.

27. A multi-element radiation detector, comprising;

a plurality of scintillation blocks elongated in one direction, parallel to each other and uniformly spaced to provide therebetween grooves, each of said scintillation blocks constituting transducer means for converting incident radiation to be detected into light;

a corresponding plurality of optical-to-electrical converters respectively connected to said scintillation blocks opposite from the incident radiation to form operative pairs;

a plurality of radiation impermeable separators filling said grooves for at least the length and height of said scintillation blocks for reducing cross-talk, each of said separators being substantially the same width, as measured between adjacent scintillation blocks;

support means securing all of said scintillation blocks and optical-to-electrical converters into a unitary detector element;

separator means, parallel to said separators, covering the complete side of at least one of the outermost ones of said scintillation blocks so that light detector elements may be placed in a side-by-side relationship with their separators parallel to each other and said separator means preventing cross-talk between adjacent detector elements, said separator means being formed on each of the opposite sides of said detector elements; and the width of said separator means between light detector elements being substantially equal to the width of each of said separators, wherein the sum of the thicknesses of said separator means, for each detector element, is equal to the thickness of each of said separators of the same detector element within an accuracy of 5 microns.

28. A multi-element radiation detector, comprising;

a plurality of scintillation blocks elongated in one direction, parallel to each other and uniformly spaced to provide therebetween grooves, each of said scintillation blocks constituting transducer means for converting incident radiation to be detected into light;

a corresponding plurality of optical-to-electrical converters respectively connected to said scintillation blocks opposite from the incident radiation to form operative pairs;

a plurality of radiation impermeable separators filling said grooves for at least the length and height of said scintillation blocks for reducing cross-talk, each of said separators being substantially the same width, as measured between adjacent scintillation blocks;

support means securing all of said scintillation blocks and optical-to-electrical converters into a unitary detector element;

separator means, parallel to said separators, covering the complete side of at least one of the outermost ones of said scintillation blocks so that light detector elements may be placed in a side-by-side relationship with their separators parallel to each other and said separator means preventing cross-talk between adjacent detector elements;

the width of said separator means between like detector elements being substantially equal to the width of each of said separators; and optically opaque adhesive substantially covering the end surfaces of said separators and adjacent operative pairs, at each end of said separators, and bonding said separators to said operative pairs for reducing cross-talk between adjacent operative pairs.

* * * * *